United States Patent
Sundaram et al.

(10) Patent No.: US 10,121,279 B1
(45) Date of Patent: Nov. 6, 2018

(54) SYSTEMS AND METHODS FOR GENERATING A MESH

(71) Applicant: Ansys, Inc., Canonsburg, PA (US)

(72) Inventors: Ravi Sundaram, Bethel Park, PA (US); James Cosentino, Pittsburgh, PA (US); Lars Eric Rickard Petersson, Harrisburg, PA (US); Magdalena Zhan, Pittsburgh, PA (US)

(73) Assignee: Ansys, Inc., Canonsburg, PA (US)

( * ) Notice: Subject to any disclaimer, the term of this patent is extended or adjusted under 35 U.S.C. 154(b) by 41 days.

(21) Appl. No.: 14/797,712

(22) Filed: Jul. 13, 2015

Related U.S. Application Data

(60) Provisional application No. 62/024,209, filed on Jul. 14, 2014.

(51) Int. Cl.
| | | |
|---|---|---|
| *G06T 15/30* | (2011.01) | |
| *G06T 15/20* | (2011.01) | |
| *G06T 15/08* | (2011.01) | |
| *G06T 17/10* | (2006.01) | |
| *G06T 17/20* | (2006.01) | |
| *G06F 17/50* | (2006.01) | |

(52) U.S. Cl.
CPC .......... *G06T 15/20* (2013.01); *G06F 17/5018* (2013.01); *G06T 15/08* (2013.01); *G06T 17/10* (2013.01); *G06T 17/205* (2013.01); *G06T 2215/16* (2013.01); *G06T 2219/2021* (2013.01)

(58) Field of Classification Search
CPC ....... G06T 17/20; G06T 12/205; G06T 15/04; G06T 15/005; G06T 11/40
USPC ........................................................ 345/423
See application file for complete search history.

(56) References Cited

U.S. PATENT DOCUMENTS

| | | | | |
|---|---|---|---|---|
| 5,841,892 A | * | 11/1998 | McGrath | .............. G06T 7/73 345/424 |
| 7,006,088 B1 | * | 2/2006 | Guskov | .............. G06T 17/20 345/420 |
| 7,467,074 B2 | * | 12/2008 | Faruque | .............. G06F 17/5018 703/1 |
| 8,390,620 B1 | * | 3/2013 | Staten | .............. G06T 17/20 345/423 |

(Continued)

OTHER PUBLICATIONS

"Finite element modeling of fatigue crack bifurcation" (by A.C.O. Miranda, M.A. Meggiolaro, J.T.P. Castro, L.F. Martha).*

*Primary Examiner* — Ke Xiao
*Assistant Examiner* — Gordon Liu
(74) *Attorney, Agent, or Firm* — Jones Day

(57) ABSTRACT

Systems and methods are provided for generating a mesh assembly. A specification of a system having first and second objects is received. The specification includes, for each of the first and second objects, geometric data for the object and mesh data comprising settings for creating a mesh representation of the object. The first object is associated with a first mesh, and the second object is associated with a second mesh. The associating includes, for each of the first and second objects, determining whether a mesh with geometric data and mesh data corresponding to that of the object has been previously generated. If the mesh has been previously generated, the object is associated with the mesh, and if the mesh has not been previously generated, the object is meshed to generate a new mesh that is associated with the object. A mesh assembly including the first and second meshes is generated.

21 Claims, 9 Drawing Sheets

(56) References Cited

U.S. PATENT DOCUMENTS

| | | | |
|---|---|---|---|
| 8,489,372 B2* | 7/2013 | L'Eplattenier | G06F 7/60 |
| | | | 703/2 |
| 8,983,808 B2* | 3/2015 | Blain | G06T 17/20 |
| | | | 703/2 |
| 9,123,166 B2* | 9/2015 | Shahpar | G06T 17/20 |
| 2014/0379308 A1* | 12/2014 | Georgescu | G06F 17/50 |
| | | | 703/1 |

* cited by examiner

GEOMETRICAL ATTRIBUTES DATA STRUCTURE — 200

| Dimension_ID | Dimension_name | Value | Units |
|---|---|---|---|
| 1 | Length | | mm |
| 2 | Width | | mm |
| 3 | Length y | | mm |
| 4 | Width x | | mm |
| 5 | Depth z | | mm |

*Fig. 2A*

MESH SETTINGS DATA STRUCTURE — 250

| Parameter_ID | Parameter_name | Value |
|---|---|---|
| 1 | Mesh type | |
| 2 | Meshing algorithm | |
| 3 | Resolution/scale | |

*Fig. 2B*

COMPONENT MESH DATA STRUCTURE — 300

| Face_ID | Vertex1_coordinates | Vertex2_coordinates | Vertex3_coordinates |
|---|---|---|---|
| F1 | (x1, y1, z1) | (x2, y2, z2) | (x3, y3, z3) |
| F2 | (x2, y2, z2) | (x4, y4, z4) | (x3, y3, z3) |
| F3 | (x2, y2, z2) | (x5, y5, z5) | (x4, y4, z4) |

*Fig. 3*

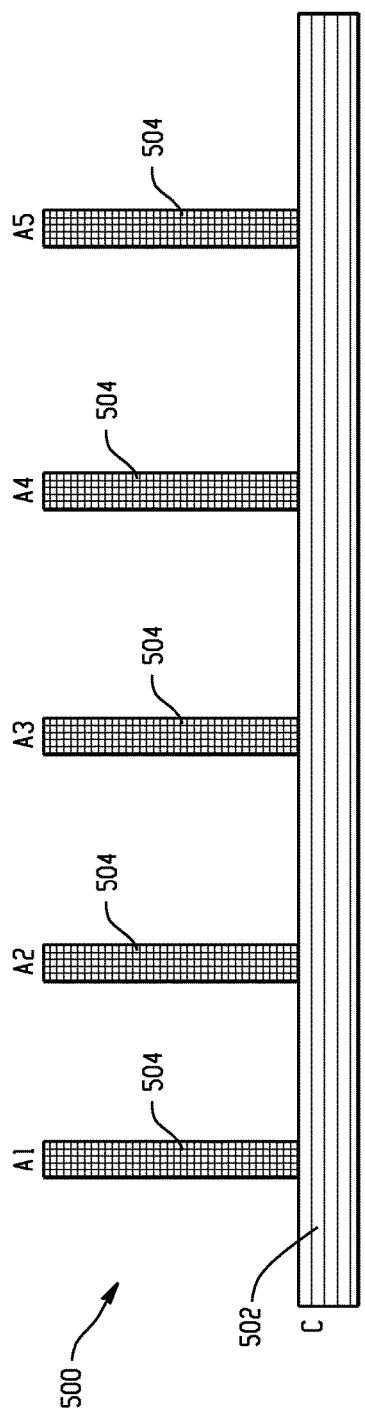
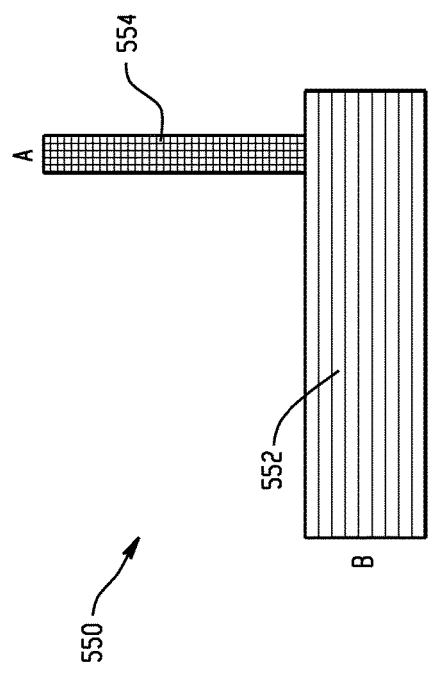
Fig. 5A
Fig. 5B

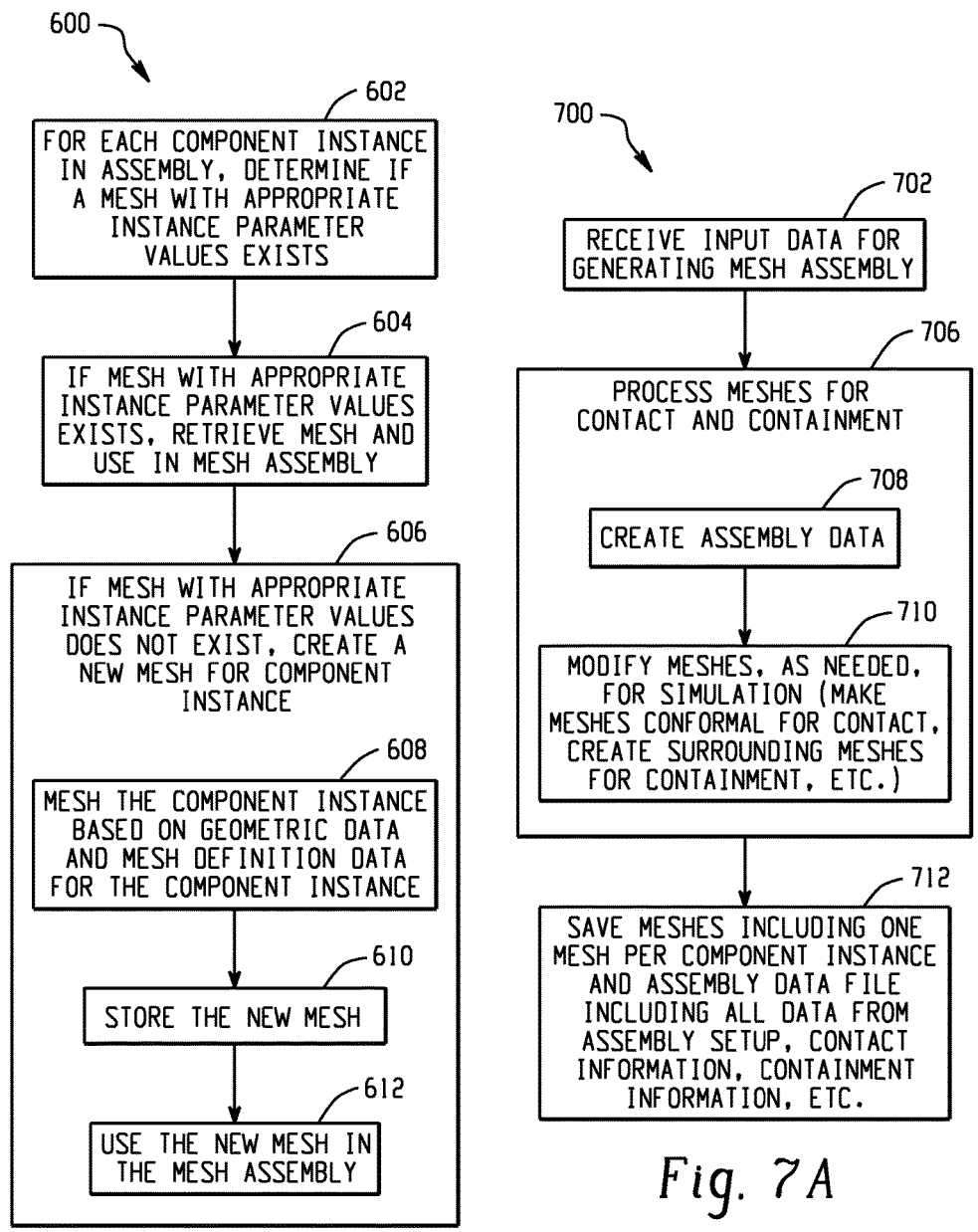

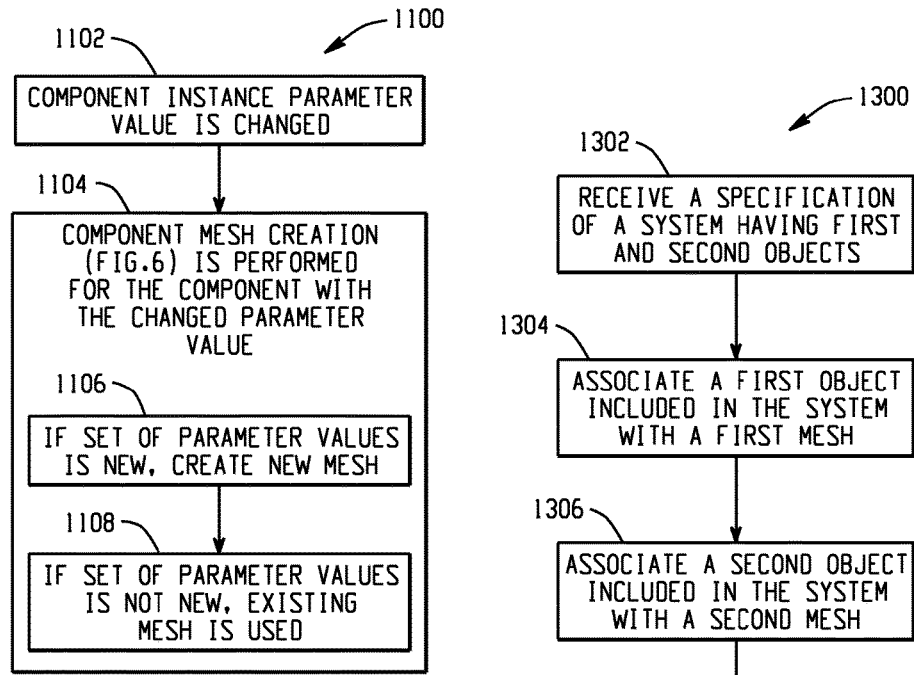
Fig. 11
Fig. 13
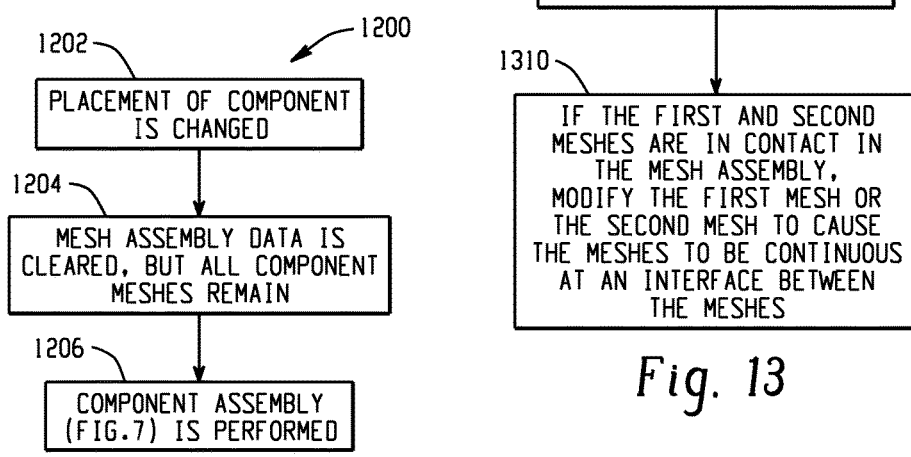
Fig. 12

SYSTEMS AND METHODS FOR GENERATING A MESH

CROSS-REFERENCE TO RELATED APPLICATIONS

This application claims priority to U.S. Provisional Patent Application No. 62/024,209, filed Jul. 14, 2014, entitled "Systems and Methods for Generating a Mesh," which is incorporated herein by reference in its entirety.

FIELD

This disclosure is related generally to computer-aided design and more particularly to systems and methods for generating a mesh assembly for simulating a physical system or structure.

BACKGROUND

A mesh includes elements that are typically simple shapes such as tetrahedrons, hexahedrons, prisms, and pyramids. These simple shapes have faces, edges, and vertices. A mesh includes a collection of these elements and a mathematical description of the relationship between the nodes, edges, and faces of the elements. In the numerical analysis of physical systems (e.g., industrial systems or volumetric objects), complicated three-dimensional shapes may be broken down into (i.e., approximated by) a mesh representation. The mesh representation may subsequently be used in setting up and solving equations for finite element analysis, which may include the numerical solution of partial differential equations. Other analysis methods are used in other examples. Mesh-based analysis techniques are used widely in the fields of computational fluid dynamics, aerodynamics, electromagnetic fields, civil engineering, chemical engineering, naval architecture and engineering, and other related fields.

SUMMARY

Systems, methods, and non-transitory computer-readable storage mediums are provided for generating a mesh assembly corresponding to a system. In an example computer-implemented method for generating a mesh assembly corresponding to a system, a specification of a system having first and second objects is received. The specification includes, for each of the first and second objects, geometric data comprising geometrical attributes of the object and mesh data comprising settings for creating a mesh representation of the object. The first object is associated with a first mesh, and the second object is associated with a second mesh. The associating includes, for each of the first and second objects, determining whether a mesh with geometric data and mesh data corresponding to that of the object has been previously generated. Based on a determination that the mesh has been previously generated, the object is associated with the mesh, and based on a determination that the mesh has not been previously generated, the object is meshed to generate a new mesh that is associated with the object. A mesh assembly including the first and second meshes is generated based on positioning data for the first and second objects included in the specification. Based on a determination that the first and second meshes are in contact in the mesh assembly, a mesh of the first mesh or the second mesh is modified to cause the meshes to be continuous at an interface between the meshes.

An example computer-implemented system for generating a mesh assembly corresponding to a system includes one or more data processors and one or more computer-readable mediums encoded with data. The data includes a data structure including a specification of a system having first and second objects. The data structure includes, for each of the first and second objects, geometric data comprising geometrical attributes of the object and mesh data comprising settings for creating a mesh representation of the object. The data also includes instructions for commanding the one or more data processors to execute steps. The steps include associating i) the first object with a first mesh, and ii) the second object with a second mesh. The associating includes determining whether a mesh with geometric data and mesh data corresponding to that of the object has been previously generated. Based on a determination that the mesh has been previously generated, the object is associated with the mesh, and based on a determination that the mesh has not been previously generated, the object is meshed to generate a new mesh that is associated with the object. The steps also include generating a mesh assembly including the first and second meshes based on positioning data for the first and second objects included in the specification. The steps further include, based on a determination that the first and second meshes are in contact in the mesh assembly, modifying a mesh of the first mesh or the second mesh to cause the meshes to be continuous at an interface between the meshes.

An example non-transitory computer-readable storage medium for generating a mesh assembly corresponding to a system includes computer executable instructions which, when executed, cause a processing system to execute steps. In executing the steps, a specification of a system having first and second objects is received. The specification includes, for each of the first and second objects, geometric data comprising geometrical attributes of the object and mesh data comprising settings for creating a mesh representation of the object. The first object is associated with a first mesh, and the second object is associated with a second mesh. The associating includes, for each of the first and second objects, determining whether a mesh with geometric data and mesh data corresponding to that of the object has been previously generated. Based on a determination that the mesh has been previously generated, the object is associated with the mesh, and based on a determination that the mesh has not been previously generated, the object is meshed to generate a new mesh that is associated with the object. A mesh assembly including the first and second meshes is generated based on positioning data for the first and second objects included in the specification. Based on a determination that the first and second meshes are in contact in the mesh assembly, a mesh of the first mesh or the second mesh is modified to cause the meshes to be continuous at an interface between the meshes.

In an example computer-implemented method for generating a mesh assembly corresponding to a system, a specification of a system having first and second objects is received. The specification includes, for each of the first and second objects, geometric data comprising geometrical attributes of the object and mesh data comprising settings for creating a mesh representation of the object. The first object is associated with a first mesh, and the second object is associated with a second mesh. The associating includes, for each of the first and second objects, determining whether a mesh with geometric data and mesh data corresponding to that of the object has been previously generated. Based on a determination that the mesh has been previously generated, the object is associated with the mesh, and based on a determination that the mesh has not been previously generated, the object is meshed to generate a new mesh that is associated with the object. A mesh assembly including the first and second meshes is generated based on positioning data for the first and second objects included in the specification. The first and second meshes are non-continuous at an area of contact between the meshes.

BRIEF DESCRIPTION OF THE DRAWINGS

FIG. 2A depicts an example data structure for storing geometrical attributes of an object.

FIG. 2B depicts an example data structure for storing mesh data comprising settings for creating a mesh representation of an object FIG. 3 depicts an example data structure for storing a mesh that is associated with a component.

FIG. 5A is a block diagram depicting a mesh assembly including multiple instances of a component.

FIG. 5B is a block diagram depicting a mesh assembly including an instance of a component, where a location of the instance has been changed as versus an original mesh assembly.

FIG. 6 is a flow diagram depicting example steps for component mesh creation.

FIG. 7A is a flow diagram depicting example steps for assembling component meshes into a mesh assembly.

FIG. 11 is a flow diagram depicting example steps for changing one or more parameters of a component instance.

FIG. 12 is a flow diagram depicting example steps for effecting a component placement change within a system to be simulated.

FIG. 13 is a flow diagram depicting an example computer-implemented method of generating a mesh assembly for simulating a physical system.

DETAILED DESCRIPTION

Figure 1A:
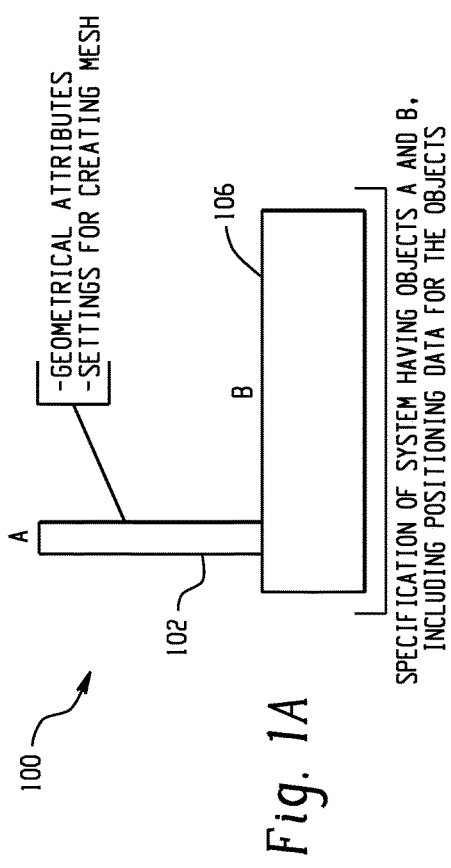
FIG. 1A is a block diagram depicting a system including first and second objects.

FIG. 1A is a block diagram depicting a system 100 including first and second objects 102, 106. The system 100 represents a physical system or structure to be analyzed via a computer-aided simulation. In analyzing the system 100, a specification of the system 100 is received. The specification of the system 100 having objects 102, 106 includes positioning data (i.e., placement data) that defines a positioning of the objects 102, 106 in relation to each other and in relation to other aspects (e.g., boundaries, etc.) of the system 100. In the illustration of FIG. 1A, the objects 102, 106 are arranged based on the positioning data. The specification of the system 100 further includes geometric data comprising geometrical attributes for each of the objects 102, 106. In an example, the geometric data defines the size and shape for each of the objects 102, 106. Although the objects 102, 106 are depicted in the example of FIG. 1A as being two-dimensional objects, it should be understood that the system 100 may also include three-dimensional objects. For such three-dimensional objects, the specification includes geometric data defining the size and shape of the objects 102, 106 in three dimensions.

In an example, the specification for the system 100 describes the geometry of the system 100 as a set of surface triangles for each of the objects 102, 106. In other examples, the specification of the system 100 and the geometry thereof are described using an industry standard geometry definition format such as IGES, STEP, or STL, or proprietary geometry formats such as ACIS, CATIA, and SDRC. The specification of the system 100 and the geometry thereof can also be specified using electronic CAD (ECAD) system databases such as GDS-II, ODB++, OpenAccess, Cadence Allegro, Mentor Expedition, Mentor PADS, Mentor Boardstation, Zuken CR-5000, and Zuken CR-8000. Some example systems and structures that can be represented by the specification include printed circuit boards, integrated circuits, cable systems including optical fiber communication systems, bundled cable systems in planes, trains, automobiles, and ships, electronic packages, and microwave devices.

The specification of the system 100 further defines physical and material attributes for each of the objects 102, 106. Such physical and material attributes are used in subsequent analysis or simulation of the system 100. The physical and material attributes include, for example, parameters for density, Young's modulus, Poisson's ratio, thermal conductivity, thermal capacity, endurance limit, yield strength, permeability, electrical conductivity, resistivity, or the like. It should be understood that these physical and material attributes are exemplary only and that various other attributes are defined by the specification in other examples.

The specification of the system 100 further includes mesh data comprising settings for creating mesh representations of each of the objects 102, 106. As described in further detail below, in analyzing the system 100, each of the objects 102, 106 is meshed individually, and the meshes for the objects 102, 106 are then assembled into a larger system for analysis and simulation. To support the independent meshing of the objects 102, 106, the settings for creating the mesh representations define, for each of the objects 102, 106, a meshing algorithm to be used in meshing a particular object and other mesh settings for the particular object (e.g., maximum element size, whether 2D or 3D meshing is to be used, whether to use optimization, etc.). In the system and method for generating a mesh assembly described herein, each of the objects 102, 106 is meshed independently of any meshing performed on other objects in the system 100, and mesh parameters are selected independently for each of the objects 102, 106. In meshing the objects 102, 106 separately of each other, the first object 102 may be meshed using a first meshing technique that is determined based on mesh data for the first object 102, and the second object 106 may be meshed using a second meshing technique that is different from the first meshing technique and determined based on mesh data for the second object 106.

In an example, the meshing of the first object 102 via the first meshing technique is used in generating a mesh for the first object 102 that is a volume mesh, and the meshing of the second object 106 via the second meshing technique is used in generating a mesh for the second object 106 that is a surface mesh. After combining the volume mesh and the surface mesh in a single mesh assembly (i.e., as described below with reference to FIG. 1B), the volume mesh may be analyzed (i.e., simulated) using a finite element analysis technique ("FEA," also referred to as "finite element method" or "FEM"), and the surface mesh may be analyzed using an integral equation analysis technique. The independent meshing of the objects 102, 106 via the different meshing techniques thus promotes efficient simulation of the system 100 by allowing different parts of the mesh assembly to be solved using different solution procedures. The independent meshing of the objects 102, 106 and use of different solution procedures improves the functioning of a computer system as compared to conventional simulation methods, because the techniques described herein permit the simulation to be carried out more efficiently (e.g., faster) and with a reduced processing burden as versus the conventional methods. It is further noted that the techniques described herein improve the functioning of the computer system without sacrificing simulation accuracy. It should be understood that the use of the volume mesh and surface mesh is exemplary only and that the mesh data for each of the objects 102, 106 may define settings (i.e., instructions, parameters, meshing algorithms, etc.) for utilizing other meshing techniques and generating other types of meshes for the objects 102, 106.

In the specification of the system 100, each of the objects 102, 106 is considered to be an instance of a component definition. Thus, for example, in FIG. 1A, the object 102 that is labeled "A" is an instance of a component definition "A," and the object 106 labeled "B" is an instance of a component definition "B." A component definition is defined based on the geometric data for the component, meshing settings for the component, and/or other parameters for the component, such that any object including parameters corresponding to those of the component definition comprises an instance of the component definition. By defining the objects 102, 106 as instances of component definitions, the specification of the system 100 thus includes a plurality of component instances with additional data for describing a spatial relationship between the component instances. The specification thus implements an object-oriented design (OOD) system, whereby complex arrangements representing physical systems and structures are built using 2D and 3D component instances.

In an example, the specification for the system 100 is stored in a data structure that is included on one or more non-transitory, computer-readable storage mediums. The one or more non-transitory, computer-readable storage mediums further include instructions for commanding one or more data processors to access and use the stored data structure or other stored information. For example, as described in further detail below, the one or more computer-readable storage mediums include instructions for commanding the one or more data processors to associate the objects 102, 106 with meshes, generate a mesh assembly, and modify the meshes as needed for simulation.

Figure 1B:
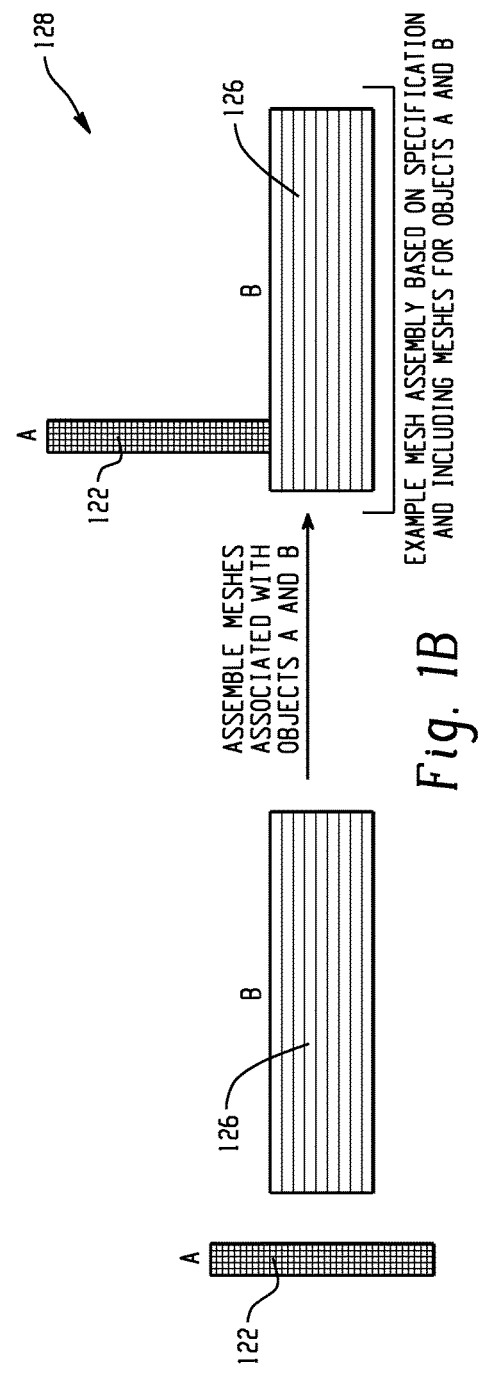
FIG. 1B is a block diagram depicting an assembling of meshes into a mesh assembly.

In FIG. 1B, the first object 102 is associated with a first mesh 122, and the second object 106 is associated with a second mesh 126. The first and second meshes 122, 126 comprise 1D, 2D, or 3D data that includes geometric and/or mathematical data required for the geometric and/or mathematical representation of the objects 102, 106. The associating of the objects 102, 106 with the meshes 122, 126, respectively, includes determining whether a mesh with geometric data and mesh data corresponding to that of the particular object has been previously generated. As an example, the geometric data for the first object 102 defines the first object 102 as having a rectangular geometry with length y1 and width x1, and the mesh data for the first object 102 includes settings indicating that the first object 102 is to be meshed using a first meshing technique with a relatively fine mesh. In associating the object 102 with a mesh, a determination is made as to whether a mesh has been previously generated for an object having geometric data (i.e., a rectangular geometry with length and width values of y1 and x1, respectively) and mesh data (i.e., settings specifying the first meshing technique with the relatively fine mesh) that corresponds to that of the object 102.

If the mesh with geometric data and mesh data corresponding to that of the object has been previously generated, the previously-generated mesh is associated with the object. The previously-generated mesh is retrieved from storage and used in further analysis and/or simulation of the system 100, such that the previously-generated mesh is reused and the object is not re-meshed. The reuse of previously-generated meshes improves the functioning of a computer system as compared to conventional methods, because the reuse of meshes permits a system to be meshed more efficiently (e.g., faster) and with a reduced processing burden as versus the conventional methods. It is further noted that the techniques described herein improve the functioning of the computer system without sacrificing mesh quality. If the mesh with geometric data and mesh data corresponding to that of the object has not been previously generated, then the object is meshed to generate a new mesh that is associated with the object. When the meshing of the object is performed, the meshing of the object is based on the geometric data and mesh data for the object. Further, in accordance with the system and method of generating a mesh described herein, the meshing of the object is performed independently of meshing of other objects included in the system 100. The system and method described herein thus utilizes a "divide and conquer" strategy, whereby components are meshed individually and the meshes are assembled into a larger system. The individual meshing of the object is not based on i) a position of the object within the system 100, ii) contact between the object and other objects in the system 100, or iii) containment of the object or another object within the system 100. As described in further detail below, the meshing of the object in this manner promotes mesh reuse while supporting highly-accurate simulation of the system 100.

After associating the first object 102 with the first mesh 122 and associating the second object 106 with the second mesh 126 (i.e., by either retrieving previously-generated meshes from memory or generating new meshes), a mesh assembly 128 is generated. As illustrated in FIG. 1B, the generation of the mesh assembly 128 includes assembling the first and second meshes 122, 126 into a larger global view. The mesh assembly 128 is generated based on positioning data for the first and second objects 102, 106 included in the specification of the system 100. Thus, in the illustration of FIG. 1B, the meshes 122, 126 are arranged based on the positioning data in a manner similar to that of the system 100 depicted in FIG. 1A. The mesh assembly 128 is further generated based on boundary conditions that define the interaction between the meshes 122, 126 and/or the interaction between the meshes 122, 126 and an external environment. The mesh assembly 128 thus combines the meshes 122, 126 for the objects 102, 106 into a single mesh based on the positioning data and the boundary conditions.

If the first and second meshes 122, 126 are in contact in the mesh assembly, a mesh of the first mesh 122 or the second mesh 126 is modified to cause the meshes 122, 126 to be continuous (i.e., conformal) at an interface between the meshes 122, 126. For example, as illustrated in the mesh assembly 128 of FIG. 1B, the meshes 122, 126 are interconnected to form a more complex shape having a continuous mesh at the interface between the meshes 122, 126. Interconnection between the meshes 122, 126 in the mesh assembly 128 is governed by rules of connectivity, which ensure a continuous mesh at the interface between the meshes 122, 126. The mesh at the interface between the meshes 122, 126 may be continuous despite each of the meshes 122, 126 having different mesh patterns, different mesh spacings, and/or different mesh types (i.e., volume meshes and surface meshes, etc.). Although the contacts between the meshes 122, 126 are described herein as utilizing continuous (i.e., conformal) meshes, in other examples, non-continuous meshes are used at the interfaces between meshes that are in contact.

After assembling the meshes 122, 126 into the mesh assembly 128 and making the mesh interfaces continuous as described above, the mesh assembly 128 is analyzed, for example, using one or more simulation techniques. Two- and three-dimensional simulation techniques utilize the meshes 122, 126 included within the mesh assembly 128 to represent the system 100 to be analyzed. Although the system 100 of FIGS. 1A and 1B is relatively simple and includes only the two objects 102, 106, it should be understood that a system to be analyzed in accordance with the systems and methods described herein may be of a higher complexity. For such systems of higher complexity, a brute-force global approach to meshing is not practical. The complexity of the system (e.g., including multiple components that require drastically different meshing scales or techniques) can overwhelm meshing algorithms used in the brute-force approaches. The process described above with reference to FIGS. 1A and 1B, whereby objects 102, 106 are meshed individually and then assembled into the mesh assembly 128, solves these problems through a divide and conquer strategy. This process thus improves the functioning of the computer system as compared to the brute-force approaches, because the process permits the simulation to be performed in a shorter amount of time and with a smaller processing burden as versus the brute-force approaches. In improving the functioning of the computer system in this manner, simulation accuracy is not sacrificed.

The process described herein also promotes meshing of complex systems by optimizing mesh reuse. An example of such mesh reuse is described above with reference to FIGS. 1A and 1B, where associating a mesh with a particular object includes determining whether a mesh with geometric data and mesh data corresponding to that of the particular object has been previously generated. As described in greater detail below, various other measures for supporting mesh reuse are employed. For example, to support mesh reuse, stored component meshes remain independent of any instance or assembly information. Thus, all information relating to placement of components, contact between components, containment of components, etc., is maintained as assembly data, outside of the component meshes. This allows the component meshes to be reused in various capacities: i) using multiple instances and parameter variations within an assembly, ii) for studies where component placement is changed, and iii) by using the same component definition in multiple mesh assemblies. Meshes continue to be reusable after mesh refinement takes place in the context of the mesh assembly. Thus, meshes for objects that have been previously generated are used as the basis for analysis of new systems and mesh assemblies.

When component meshing is required (i.e., a previously-generated mesh cannot be reused), the meshing of the individual component utilizes appropriate meshing algorithms and settings based on both the geometry content and the desired simulation method for the component. For example, surface meshes are used for some components while volume meshes are used for other components. When such meshes are assembled into a mesh assembly, the mesh assembly thus includes meshes of various different types (e.g., the mesh assembly may include components meshed via volume-meshing techniques and components meshed via surface-meshing techniques). As an example, the analysis of a system including a large aircraft and a small antenna may utilize meshes of different types. The antenna is considered a first object of the system (i.e., similar to the object 102 of FIG. 1A), and the aircraft is considered a second object of the system (i.e., similar to the object 106). In independently meshing the antenna and the aircraft objects, a volume-meshing technique is used for the antenna, and a surface-meshing technique is used for the aircraft. The independent meshing of these objects may utilize vastly different meshing scales (i.e., mesh resolutions), where the antenna is meshed with a relatively high resolution, and the aircraft is meshed with a lower, coarser resolution. In an example, the meshing scale used for the antenna differs in size from the meshing scale used for the aircraft by one or more orders of magnitude. Despite the differences in the mesh types, algorithms, and scales used for the individual objects, the meshes generated for the antenna and the aircraft are combined in a single mesh assembly. The meshes for the antenna and aircraft are made continuous at an area of contact between the meshes, and the mesh assembly is thereafter simulated using one or more simulation techniques.

The system and method of generating a mesh assembly described herein promotes efficient simulation and solving of complex systems. Specifically, the mesh generation techniques described herein allow for mixing of simulation and solution procedures. By generating a mesh assembly including component meshes of different types (e.g., both volume meshes and surface meshes), a solver used in simulating the mesh assembly can apply a first analysis method on a first part of the mesh assembly and a second analysis method on a second part of the mesh assembly. With reference again to the analysis of the system including the large aircraft and the small antenna, a finite element analysis technique may be applied to the volume mesh corresponding to the antenna, and an integral equation analysis technique may be applied to the surface mesh corresponding to the aircraft. Thus, rather than using a single analysis technique over the entire mesh assembly, multiple different analysis techniques (e.g., finite element analysis, boundary element analysis, integration equation analysis, etc.) may be used for different parts of the mesh assembly, thus promoting efficient simulation.

Figure 1C:
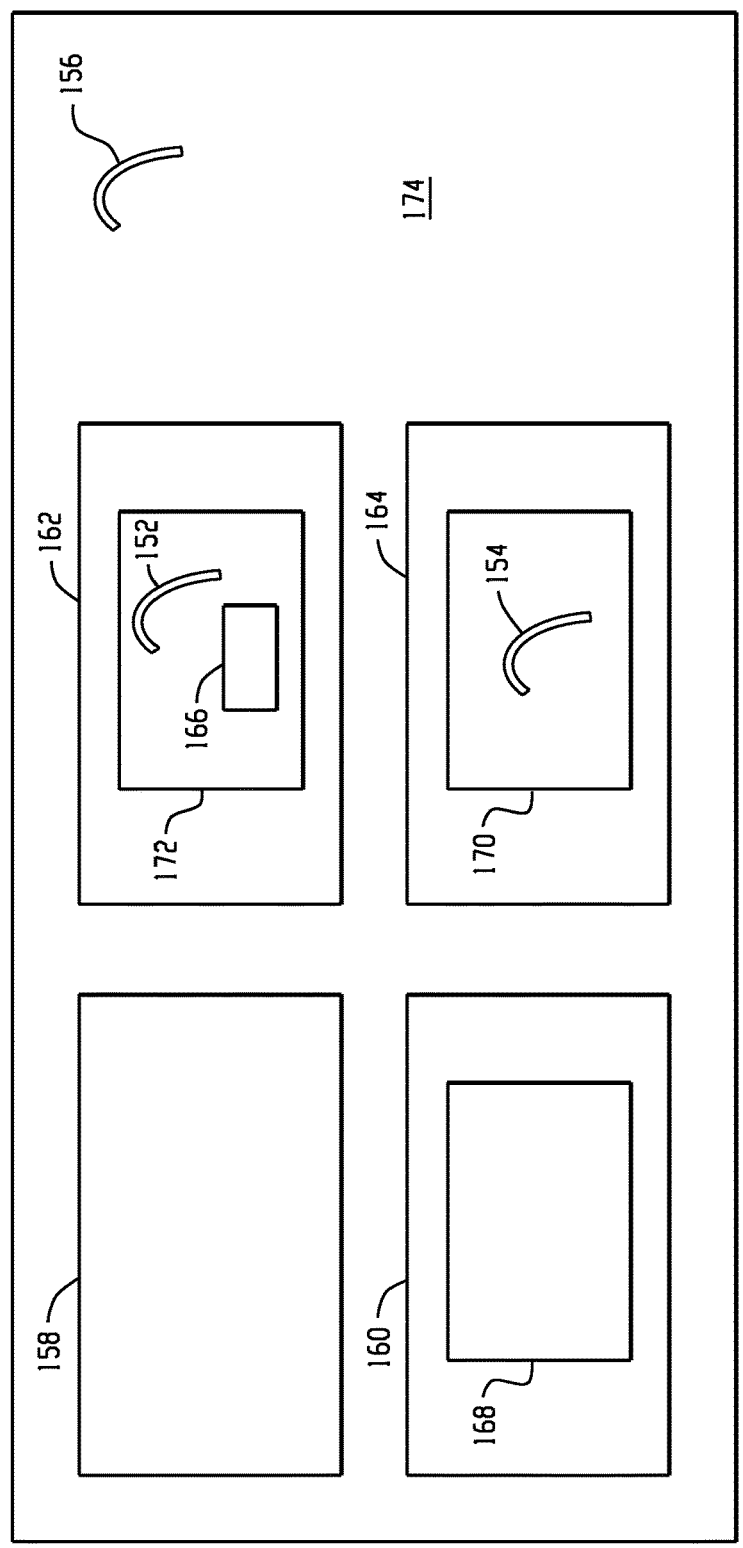
FIG. 1C illustrates the use of different analysis methods on different parts of a mesh assembly.

FIG. 1C illustrates the use of different analysis methods on different parts of a mesh assembly. In this figure, the curved arcs 152, 154, 156 may represent surface meshes. The rectangles 158, 160, 162, 164 may represent regions solved using the finite element analysis technique. Three of the FEM regions 160, 162, 164 have regions that were solved using the integral equation analysis technique. Those regions solved using the integral equation analysis technique are represented by (i) rectangle 168 inside of the larger rectangle 160, (ii) rectangle 172 inside of the larger rectangle 162, and (iii) rectangle 170 inside of the larger rectangle 164. Region 166, inside of the larger rectangle 172, may be another region solved using the finite element analysis technique. The space 174 outside of the FEM regions 158, 160, 162, 164 may be solved using the integral equation analysis technique. The spaces solved using the integral equation analysis technique may contain volume meshes and surface meshes. It should be understood that FIG. 1C is merely an example and that the use of different analysis techniques may be employed in various other configurations in other examples.

As referred to herein, a "volume mesh" may be a tetrahedral mesh used in finite element analysis solutions. The tetrahedrons of a volume mesh may be assigned to a "body" (e.g., a 2D or 3D body), and the tetrahedrons may themselves contain 2D bodies. Each tetrahedron has four triangles, and thus, it should be understood that a volume mesh also contains triangles, where the triangles are associated with faces of the model. In general, portions of a mesh assembly solved using the finite element analysis technique are meshed with tetrahedrons.

As referred to herein, a "surface mesh" may be a triangular mesh. The surface mesh does not have any tetrahedrons. A source model for a surface mesh can contain both 2D bodies and 3D bodies. For the 3D bodies, only the surface of the bodies are meshed using triangles. Surface meshes are used in the integral equation method. In an example, portions of a mesh assembly solved using the integral equation method are referred to as cavity regions. An infinitely large cavity is assumed to be present as the "root cavity" or "cavity number 0" in mesh assemblies. All other meshes of the mesh assembly are deemed to be present inside this root cavity.

As referred to herein, a "facet" may be a set of contiguous triangles. All triangles of a facet should belong to the same set of model faces and have the same pair of regions on either side. An input geometry, as used herein, is defined to consist of a number of 2D or 3D bodies. The surface of a body, which forms the boundary between the "inside" of the body and the "outside" of the body, is divided into a number of model faces. The term "model face," commonly used in CAD geometry descriptions, is known to those of ordinary skill in the art. The topology of a "body" in computation geometry is as follows: a body consists of a number of lumps, where a lump is a contiguous region of a body. The lump is enclosed by a number of shells, and the shells are divided into a number of faces. Faces are surfaces bounded by polygons, where the polygons are called loops. The loops include a number of edges, where the edges may be curvilinear or rectilinear.

The collection of boundary triangles of a cavity is described below with reference to FIG. 4. For volume meshes, the triangles that exist on the interface between solved regions and unsolved regions are boundary triangles. All of the triangles of the surface meshes are boundary triangles. All of the boundary triangles that would interact with one another are associated with a cavity. These are the boundary triangles of a cavity.

FIG. 2A depicts an example data structure 200 for storing geometrical attributes of an object. As described above with reference to FIGS. 1A and 1B, in generating a mesh assembly corresponding to a physical system, geometric data comprising geometrical attributes for objects of the physical system is received. In an example, the geometric data for a first object of the physical system is stored in a first data structure, and the geometric data for a second object of the physical system is stored in a second data structure. FIG. 2A depicts an example data structure 200 for storing such geometric data.

As seen in the example data structure 200, each object has a set of attributes defining its geometry. For two-dimensional objects, the data structure 200 is configured to store data for a length and width of the object, and for three-dimensional objects, the data structure 200 is configured to store data for length y, width x, and depth z of the object. It should be understood that in other examples, the data structure 200 for storing the geometric data includes additional other fields for storing attributes of more complex 2D and 3D objects. It should also be understood that the types of fields illustrated in the example of FIG. 2A are exemplary only and that any suitable data structure for storing data describing the geometry of an object may be used. For example, the data structure 200 may store geometric data as defined by the IGES, STEP, STL, ACIS, CATIA, SDRC, CAD, GDS-II, and ODB++ standards, among others. Although the example data structure 200 of FIG. 2A illustrates the data structure 200 as storing geometric data only, in other examples, physical and/or material attributes for an object are also stored in the data structure defining the geometry of the object. Such physical and/or material attributes for the object are used in subsequent simulations and include, for example, parameters for density, Young's modulus, Poisson's ratio, and thermal conductivity of the object, among others.

FIG. 2B depicts an example data structure 250 for storing mesh data comprising settings for creating a mesh representation of the object. As described above with reference to FIGS. 1A and 1B, in generating a mesh assembly corresponding to a physical system, mesh data comprising settings for creating mesh representations of objects of the physical system is received. In an example, the mesh data for a first object of the physical system is stored in a first data structure, and the mesh data for a second object of the physical system is stored in a second data structure. FIG. 2B depicts an example data structure 250 for storing such mesh data. As illustrated in the example data structure 250, each object has a set of attributes defining settings for creating a mesh representation of the object. The settings stored in the data structure 250 define a mesh type for the object (e.g., whether the object is to be meshed to create a volume mesh or a surface mesh, etc.), a meshing algorithm to be used in generating the mesh, and a resolution/scale to be used in the meshing of the object. It should be understood that the types of fields illustrated in the example of FIG. 2B are exemplary only and that any suitable data structure for storing data describing the settings for creating a mesh representation of the object may be used (e.g., settings specifying or defining a finite difference mesh, finite volume mesh, and/or finite element mesh attributes or the like).

In an example, for a system to be simulated that includes first and second objects (e.g., a system similar to the system 100 described above with reference to FIG. 1A), the geometric data for the first object is stored in a first data structure, and the geometric data for the second object is stored in a second data structure (e.g., first and second data structures similar to the data structure 200 depicted in FIG. 2A). The mesh data for the first object is stored in a third data structure, and the mesh data for the second object is stored in a fourth data structure (e.g., third and fourth data structures similar to the data structure 250 depicted in FIG. 2B). In other examples, the first, second, third, and fourth data structures described herein are combined, and fewer data structures are used. For example, a first data structure may store both geometric data and mesh data for the first object, and a second data structure may store both geometric data and mesh data for the second object. In another example, a single data structure stores geometric and mesh data for all objects included in the system to be simulated.

FIG. 3 depicts an example data structure 300 for storing a mesh that is associated with an object. As described above with reference to FIGS. 1A and 1B, each object included within a system to be simulated is meshed individually, and the mesh generated for the object is stored in memory to facilitate reuse of the mesh. In an example, the data structure 300 stores such a mesh in memory. A mesh for an object may be represented in a number of different formats. For example, the mesh may be represented based on independent faces of the mesh, a combination of vertex and face information for the mesh, and adjacency information for the mesh, among other formats. The example of FIG. 3 depicts the data structure 300 for storing data on independent faces of a mesh. Each face of the mesh is defined by vertex coordinates, and in the example of FIG. 3, a mesh to be stored includes three faces F1, F2, and F3. The data structure 300 stores vertex information for each of the three faces. It should be understood that the types of fields illustrated in FIG. 3 are exemplary only and that any suitable data structure for storing a mesh may be used.

Figure 4:
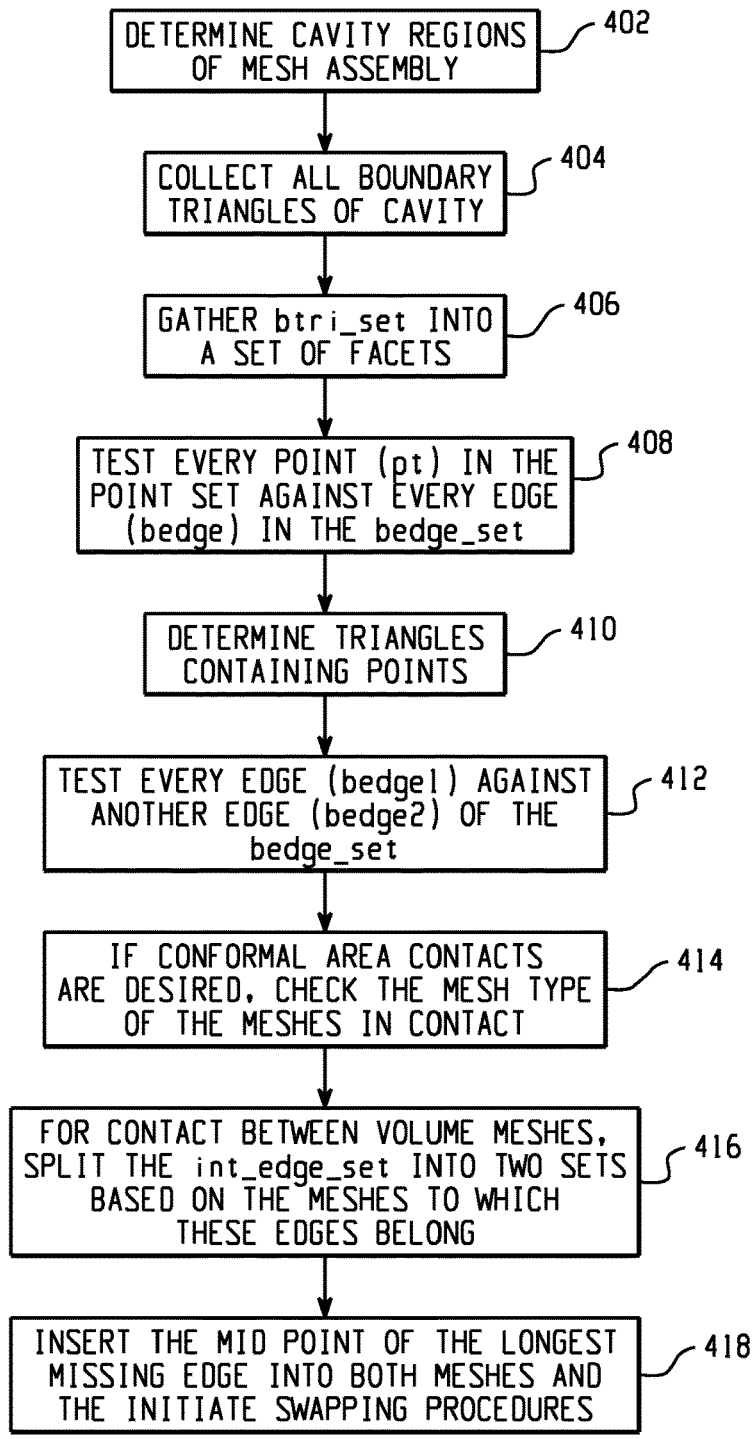
FIG. 4 is a flow diagram depicting example steps for making meshes conformal at an area of contact.

FIG. 4 is a flow diagram depicting example steps for making meshes conformal at an area of contact. At 402, take all the meshes that form an assembly and determine the cavity regions. All the remaining steps will be performed for each cavity in the assembly. The assembly consists of volume meshes and surface meshes. As these cavities are processed one by one, the cavity being processed is termed the "current cavity." At 404, collect all the boundary triangles of the current cavity. If there are contacts between meshes that will happen within these triangles. Contacts will not happen between boundary triangles of one cavity with the boundary triangles of another cavity. This set of triangles is termed "btri_set." At 406, this btri_set is gathered into a set of facets. Each triangle has three edges. The edges on the boundary of a facet are called boundary edges (also referred to as preserved edges or unswappable edges). Edges that are interior to facets are called unpreserved edges and are also known as interior edges or swappable edges. A set of boundary edges and a set of interior edges are collected from the btri_set. These boundary edges and interior edges are termed "bedge_set" and "intedge_set," respectively. A list of all the points of the btri_set triangles is made. This list is termed "point_set."

At 408, every point (pt) in the point set is tested against every edge (bedge) in the bedge_set. If geometrically the location of pt is on the bedge, but not at the ends, then an edge containing point has been found. Thus, bedge belongs to mesh1. mesh1 does not have a point coincident to pt, because all input meshes are conformal. So pt is able to be inserted into mesh1. The insertion will delete the bedge from mesh1 and create two new edges. This process is repeated until no point in the point_set is interior to any edge in the bedge_set. This process is guaranteed to terminate. At 410, look for triangles containing points in a manner similar to the determining of preserved edges containing points in 408. Every point (pt) in the point_set is tested against every triangle (tri) in the btri_set. When a triangle containing point is found, the point is inserted into the mesh of that triangle. Such points will be interior to triangles or interior to interior edges. This process is repeated until no such point could be found. This process is guaranteed to terminate.

At 412, every edge (bedge1) is tested against another edge (bedge2) of the bedge_set. If they intersect, and the intersection will be interior to both edges. The intersection points are inserted into both meshes. Two edges touching at the end points are not considered intersecting. End point of one edge will not be in the interior of another edge because of step 408. This process is guaranteed to terminate. At this stage all the outlines of contacts between meshes are conformal. The interior triangulation on the contacts might not be conformal. But the outlines will exactly match for all meshes in contact. If the solver does not require conformal triangulation of areas, the procedure is stopped now. At 414, if conformal area contacts are desired, the mesh type of the meshes in contact are checked. If one (or both) of the meshes is a surface mesh all triangles are dropped in the interior of the first surface mesh and copy the triangulation from the other mesh. If both meshes are volume meshes, the interior triangles cannot be borrowed from the other mesh. In the volume mesh there are tetrahedrons attached to the triangles, and the triangulation cannot be simply copied.

At 416, for contact between volume meshes, split the int_edge_set into two sets based on the meshes these edges belong to. These sets are termed int_edge_set1 of all edges belonging to mesh1 and int_edge_set2 for all edges belonging to mesh2. For a continuous mesh, there should be one-to-one correspondence between these two sets. If there is an edge on one set that is missing on the other, it would be termed a missing edge. Since the missing edges are all interior edges, try to swap these edges in the mesh to achieve a match. This loop is repeated after every swap. When the missing edge set is empty the process is complete. If no swaps could be done, and the missing edge set is not empty, proceed to the next step of inserting points. This process can get into endless loop and bistable states. Selecting the edge to swap and the swap procedure must be implemented carefully to avoid endless loops. At 418, the mid point of the longest missing edge is inserted into both meshes and swapping procedures are initiated. This is repeated until the missing edge set is empty. The volume mesh swapping procedures give priority to surface triangle mesh quality. Thus, when the point sets are identical between the two meshes, the triangulation will be unique, and the edge swapping procedure would proceed towards this unique triangulation.

Pseudo-code illustrating an example method for making meshes conformal at an area of contact may include the following:

for each cavity current_cavity in the assembly do {
　//preparation
　collect all the triangles of current_cavity into a set btri_set
　group the triangles of btri_set into a set of facets facet_set
　collect all boundary edges of btri_set into bedge_set
　collect all interior edges of btri_set into intedge_set
　collect all points of btri_set into point_set
　//Boundary edge containing points.
　for each edge be in bedge_set do {
　Find a point pt in the point_set that is inside be
　if pt is not found break loop
　let mesh1 be the mesh of be
　insert pt into mesh1
　}
　//Triangles containing points.
　for each tri in the btri_set{
　find a point pt in the point_set that is inside tri
　if pt is not found break loop
　let mesh1 be the mesh of tri
　insert pt into mesh1
　}
　//Boundary edge intersecting preserved edges
　for each pe1 in the bedge_set{
　find pe2 that intersects pe1
　if pe2 is not found break loop
　let intpos be the intersection of pe1 and pe2

```
insert intpos into both meshes
}
//outlines are conformal now.
if outline conformal mesh is sufficient break loop
//Borrow meshes if possible
if(mesh1 is surf mesh){
copy interior triangulation of mesh2 into mesh1
break loop;
}
if (mesh2 is surf mesh){
copy interior triangulation of mesh1 into mesh2
break loop
}
//Volume meshes in contact.
label: collect missing edges.
for each edge ie in int_edge_set{
if ie belongs to mesh1 add it to int_set1
else if ie belongs to mesh2 add it to int_set2
for each edge je in int_set1{
   if (je has no partner in int_set2){
   add je to missing_edgeset
   }
for each edge ke in int_set2{
   if(ke does not have partner in int_set1){
      add ke to missing_edgeset
   }
}
}
if (missing_edgeset is empty){
break loop;//done!
}
for the longest edge le in missing_edgeset){
if (swapping will produce smaller edge){
   swap le
   continue loop
}
Let midp be the midpoint of le
   insert midp into mesh1 and mesh2
   break loop;
}//missing edge set.
//after each point insertion and swap, we need to regather
//and update all interior edges and missing edges.
   goto label: collect missing edges.
}//all cavities
```

FIG. 5A is a block diagram depicting a mesh assembly 500 including multiple instances of a component 504. As described above with reference to FIGS. 1A and 1B, the system and method of generating a mesh assembly described herein utilizes i) individual meshing of each object included in a system to be simulated, and ii) reuse of previously-generated component meshes to lessen a processing burden associated with meshing the entire system. FIG. 5A depicts an example of a situation in which component meshes are reused in this manner. The mesh assembly 500 of FIG. 5A includes a mesh 502 for an object "C" and five instances of a mesh 504 for an object "A." Rather than re-meshing the object "A" five times to generate the five meshes 504 for the mesh assembly 500, a determination is made as to whether a mesh with appropriate instance parameter values exists. After the object "A" has been meshed a first time, the determination will indicate that the mesh does exist and that the mesh for the object "A" should be retrieved and subsequently used in the mesh assembly 500. In an example, a mesh assembly similar to the mesh assembly 500 of FIG. 5A is used to simulate an array of antennas. After meshing a single one of the antennas, the mesh can be reused multiple times within the mesh assembly, thus eliminating a need to mesh each antenna of the array.

In an example, a first object included in a system has geometric data and mesh data as described above with reference to FIGS. 1A and 1B. The first object is associated with a first mesh, where the first mesh is generated based on the geometric data and mesh data for the first object and is not based on i) a position of the object within the system, ii) contact between the object and other objects of the system, and iii) containment of the object or another object within the system. A second object in the system has geometric data and mesh data equal to that of the first object, but the second object has a placement (i.e., position) in the system that differs from that of the first object. The second object is associated with the first mesh, such that the second object need not be meshed. The mesh assembly for the system including the first and second objects includes multiple instances of the first mesh to represent the first object and the second object within the system.

Although the example of FIG. 5A illustrates reuse of a component mesh within a single mesh assembly 500, in other examples, a component mesh is reused across multiple different mesh assemblies. For example, the mesh assembly 128 of FIG. 1B including component meshes 122, 126 for first and second objects 102, 106 is generated at a first point in time. Subsequently, in generating a second mesh assembly at a second point in time, a second specification of a second system to be simulated is received, where the second specification includes geometric data and mesh data for a third object. It is determined if either of the component meshes 122, 126 utilized in the mesh assembly 128 are based on geometric data and mesh data corresponding to that of the third object, and if so, the third object is associated with the corresponding mesh of the meshes 122, 126. The association of the third object with the corresponding mesh of the meshes 122, 126 is made without meshing the third object. The second mesh assembly is then generated using the mesh associated with the third object, where the second mesh assembly corresponds to the second system. In this manner, the corresponding mesh of the component meshes 122, 126 is reused across multiple different mesh assemblies. The reuse of the corresponding mesh is facilitated by retrieving the corresponding mesh from a data structure (e.g., a data structure similar to that depicted in FIG. 3) that stores the mesh.

FIG. 5B is a block diagram depicting a mesh assembly 550 including an instance of a component 554, where a location of the instance has been changed as versus an original mesh assembly. The mesh reuse described herein facilitates numerous applications, including studies in which component placement is changed within a mesh assembly. FIG. 5B depicts an example of such a study. The mesh assembly 550 of FIG. 5B includes a mesh 552 for an object "B" and a mesh 554 for an object "A." The objects "A" and "B" correspond to the objects "A" and "B" of FIGS. 1A and 1B, but it can be seen that a placement of the object "A" with respect to object "B" has changed in the mesh assembly 550 of FIG. 5B as versus the mesh assembly 128 of FIG. 1B. Rather than re-meshing the objects "A" and "B" in generating the mesh assembly 550, the meshes 122, 126 used in the mesh assembly 128 of FIG. 1B are retrieved and used in the mesh assembly 550.

In an example, a first object included in a system has geometric data and mesh data as described above with reference to FIGS. 1A and 1B. The geometric data and mesh data are included within a specification of the system that also includes positioning data for the first object within the system. The first object is associated with a first mesh, and the first mesh is used in generating a first mesh assembly corresponding to the system. The positioning data included within the specification is edited to alter a position of the first object in the system. In generating a second mesh assembly based on the edited positioning data, the first object is not re-meshed. Rather, the mesh for the first object is retrieved from memory and used in the second mesh assembly. Such reuse of the mesh is permitted because the stored mesh for the first object is independent of any instance or assembly information. For example, all information relating to placement of the mesh, contact between meshes, containment of the mesh or other meshes, etc., is maintained as assembly data outside of the component meshes. In performing studies in which component placement is changed within the mesh assembly, measures may be taken to avoid impressions (e.g., hysteresis) as the position of the component changes.

FIG. 6 is a flow diagram 600 depicting example steps for component mesh creation. In the system and method of generating a mesh assembly corresponding to a physical system, each component is meshed individually, and meshes for the components are then assembled into a larger system. Thus, the flow diagram 600 illustrates example steps for associating a mesh with a particular object, where an assembly of components (i.e., a specification describing a physical system or structure) is received or generated. At 602, for each component instance in the assembly, a determination is made as to whether a mesh with appropriate instance parameter values exists. In an example, the determination includes determining if a mesh with geometric data and mesh data corresponding to that of the component instance has been previously generated and stored. In other examples, other instance parameter values are considered in determining whether the mesh with appropriate instance parameter values exists.

At 604, if the mesh with appropriate instance parameter values exists, the mesh is retrieved and used in generating a mesh assembly corresponding to the system. At 606, if the mesh with appropriate instance parameter values does not exist, a new mesh is created for the particular component instance. The creation of the new mesh includes, at 608, meshing the particular component instance based on a definition for the component and instance parameters for the particular component instance. In an example, the meshing based on the definition and the instance parameters includes meshing the particular component instance based on geometric data for the particular component instance and mesh definition data (e.g., meshing settings) for the component instance. In this manner, appropriate meshing is used based on the mesh settings for the component. For example, the mesh settings may specify the meshing algorithm to be used for the component instance.

At 610, the new mesh is stored using the instance parameter values in a non-transitory, computer-readable storage medium. In an example, the new mesh is stored in a data structure (e.g., a data structure similar to the data structure 300 of FIG. 3) that is configured to store a component mesh. Storing the new mesh in the non-transitory, computer-readable storage medium enables reuse of the mesh within a single mesh assembly (e.g., multiple instances and parameter variations within the single mesh assembly), within different mesh assemblies (e.g., same component definition being used in multiple assemblies), and for other applications (e.g., studies where component placement is changed). Thus, for example, if an assembly contains multiple instances of the same definition with the same parameter values, the mesh for these instances is created only once. At 612, the new mesh is used in generating the mesh assembly corresponding to the system.

FIG. 7A is a flow diagram 700 depicting example steps for assembling component meshes into a mesh assembly. In the system and method of generating a mesh assembly described herein, meshes for components are assembled into a larger system. As described above, such mesh assembly is performed across different mesh types, with further consideration for the simulation methods that are used across the assembly. For example, during assembly, contacts between components may require conformal or non-conformal meshes, and containment may or may not require a surrounding volume mesh. The flow diagram 700 of FIG. 7A illustrates example steps for performing such component assembly.

At 702, input data for generating the mesh assembly is received. The input data includes a mesh for each component instance and assembly setup information. In an example, the assembly setup information includes i) data on the placement of component instances, ii) mapping of data from component definitions to component instances, iii) component meshing and simulation settings, and iv) assembly-level meshing and simulation settings. The assembly-level meshing settings include settings (e.g., meshing algorithms and parameters) for meshing the mesh assembly, and the assembly-level simulation settings include parameters for performing simulation of the mesh assembly. Meshes for each of the component instances may be stored in data structures. For example, for a system including two component instances, first and second meshes are stored in first and second data structures, respectively, prior to the combining of the first and second meshes in a single mesh assembly. The stored first and second meshes are not altered by the generating of the mesh assembly, and the stored first and second meshes are not based on the data for the placement of the component instances. The stored first and second meshes are also not based on the assembly-level meshing and simulation settings.

Figure 7B:
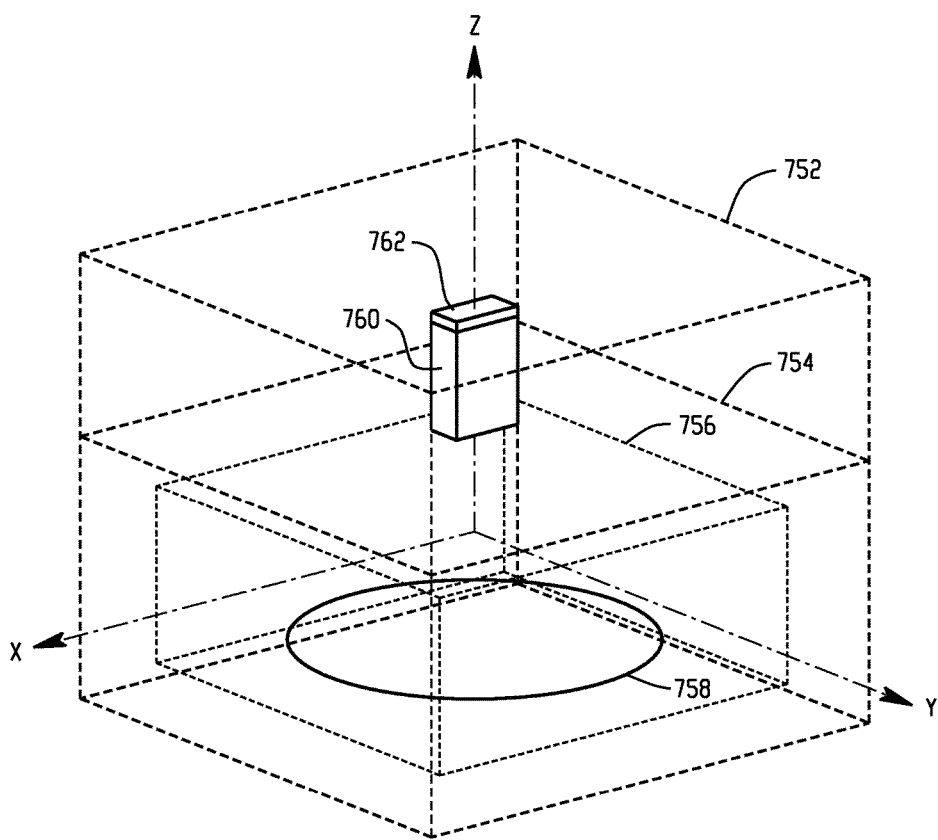
FIG. 7B depicts a collection of bodies and illustrates the concepts of containment and contact.

At 706, the meshes for the component instances are processed for contact and containment using the assembly setup information. FIG. 7B depicts a collection of bodies and illustrates the concepts of containment and contact. Depicted in this figure is a first box 752. Subsequent to the creation of the first box 752, a second box 754 that occupies a lower half of the first box 752 may be created. Both of the first and second boxes 752, 754 are vacuum in the example of FIG. 7B. Subsequent to the creation of the second box 754, a third box 756 may be created inside of the second box 754. Inside the third box 756, a circular 2D object 758 may be created. A "2D object" or "2D body" may also be referred to as a "sheet body." Outside the second box 754 but inside the first box 752, two boxes 760, 762 may be formed. The two boxes 760, 762 are formed in the top half of the first box 752. The box 762 is the small box on top of the box 760.

In this example, the first box 752 contains three bodies, which are the boxes 754, 760, and 762. The second box 754 contains the third box 756. The third box 756 contains one 2D body, which is the circular 2D object 758. There is only one contact, and this is between the boxes 760 and 762. In an example, a user may wish to use the integral equation ("IE") analysis technique inside the third box 756 and outside of the first box 752. There are two cavities in this project, i.e., an infinite cavity in which the entire model is contained, and another cavity to represent the third box 756. All of the triangles on the surface of the third box 756 and on the circular 2D object 758 interact, and they are assigned to the second cavity. The outer surface triangles of the first box 752 are assigned to the infinite cavity called "cavity 0" or "background cavity."

In an example, meshes are used to detect contacts and containments. As described herein, the assembly may be treated as a collection of meshes, where (i) some of the meshes are surface meshes, consisting of only triangles, and (ii) other meshes are volume meshes, consisting of tetrahedrons. Volume meshes mesh their space completely without gaps or overlap. A native mesh is assumed to occupy the infinite space, even if its meshed region is finite, and even if it is missing entirely in the assembly. In detecting the contacts and containments, triangles of surface meshes are collected, and a set of triangles for the surface meshes is formed. Likewise, an outer envelope of triangles of a volume mesh is collected, and a set of triangles for the volume meshes is formed. Thus, for all meshes, surface or volume, sets of triangles are formed (e.g., referred to herein as "surface triangle set").

In an example, a mesh in the assembly is considered, and the mesh's surface triangle set is labeled "A." Sample points from this envelope are collected. These sample points are simply centroids of the triangles. In an example, up to four sample points are collected, although only one sample point may be necessary, and any additional sample points may be used for "sanity checks" and/or user error detection. For each sample point, the tetrahedron that contains the point in some volume mesh is detected. If more than one volume mesh contains that sample point, the smallest (by total meshed volume) region is deemed to contain the sample point.

After locating the tetrahedron that contains the sample point, an expanding search from that tetrahedron without crossing any boundaries is performed. The boundary triangles found in the search process are collected into another set of triangles. This set of triangles may be labeled "B" in this example. All of the triangles of set A will interact with set B, and if there is contact between these two meshes, it will be on these triangles. By repeating this process on all the meshes of the assembly, the containment tree and the interacting triangles map may be completed. The repeating of the process also detects the contacts between the meshes.

Pseudo-code illustrating an example method for using meshes to detect contacts and containments may include the following:

```
//Preparation
for each mesh m1 in the assembly{
    if ( m1 is a volume mesh ) {
        collect its outer surface triangles
    }
    group triangles of mesh into connected sets of triangles
}
//containment and cavities
for each connected triangle set tset {
    collect sample points set pt_set from tset
    for each pt in pt_set {
        for each body b1 in all volume meshes{
            if (b1 contains pt ) {
                associate tset with b1
                breakloop
            }
        }
        if (no b1 contains pt){
            associate tset with infinite cavity
        }
    }
}
//Contact procedure
for each cavity bc in the assembly{
    collect all triangles associated with bc as triset
    group triset into facets as ft_set
    for each facet ft in the ft_set{
        collect sample points set pt_set
        for each point pt in the pt_set{
            find facet ft2 containing pt
            if ( ft2 exists ){
                ft and ft2 are in contact
            }else {
                ft is not in contact with any facet
            }//contact facet found
        }//sample pt loop per facet
    }//facet loop
}//cavity loop
```

With reference again to FIG. 7A, at 708, in processing the meshes for contact and containment, assembly data is created. The created assembly data includes, in an example, i) contact maps for facets, edges, etc., and ii) data on containment of components in meshed or unmeshed regions. At 710, in processing the meshes for contact and containment, the meshes are modified as needed for simulation. In an example, the modifying of the meshes for simulation includes making meshes conformal for contact (e.g., as described above with reference to FIG. 4). The modifying of the meshes may also include creating surrounding meshes as needed for containment and modifying meshes by refinement or additional mesh generation data. In the example including the first and second meshes, when the first mesh is fully contained within the second mesh and when an overlap of the first mesh and the second mesh is in a region of the second mesh corresponding to a uniform body (e.g., one lump), the following algorithm may be implemented: (i) discard all mesh elements of the second mesh in the overlap region and label this mesh as "mesh_2b"; (ii) adjust the meshes such that mesh_2b conforms to the exterior facets of the first mesh; and (iii) if desired (i.e., optionally), make mesh_2b and the first mesh conformal.

Although meshes may be modified for simulation, as described above, the component meshes stored in data structures (e.g., as described above with reference to FIG. 6) are not altered by such modification. Further, assembly information is not introduced into the component meshes that are stored in the data structures. For example, as described above with reference to FIGS. 1A and 1B, if two component meshes are in contact in a mesh assembly, a mesh of one or more of the meshes in contact may be modified to cause the meshes to be continuous at an interface between the meshes. Prior to the modifying of the mesh, component meshes corresponding to the meshes in contact are stored in computer-readable memories and/or data structures residing on such memories. The modifying of the mesh does not alter the component meshes stored on the computer-readable memories and/or data structures, thus promoting reuse of the stored component meshes. The reuse of previously-generated meshes improves the functioning of a computer system as compared to conventional methods, because the reuse of meshes permits a system to be meshed more efficiently (e.g., faster) and with a reduced processing burden as versus the conventional methods. It is further noted that the techniques described herein improve the functioning of the computer system without sacrificing mesh quality. In generating another mesh assembly, the component meshes stored on the computer-readable memories and/or data structures are retrieved and used. As described above, the stored component meshes are not based on mesh placement, contact between meshes, or containment of meshes. Such placement, contact, and containment data comprise assembly data this is maintained outside of the component meshes.

At 712, the processed meshes are saved. In an example, one mesh per component instance is saved, and all data is based on the component definition. The saving of the processed meshes further includes saving an assembly data file that includes all data from the assembly setup information, data relating to contact, and data relating to containment, among other information. The meshes saved at 712 may be different from those meshes saved earlier in the process (e.g., the component meshes described above with reference to FIG. 6) because the meshes saved at 712 may have been modified as needed for simulation (e.g., making meshes conformal for contact, creating surrounding meshes for containment, modifying meshes by refinement or additional mesh generation, etc.).

Figure 8:
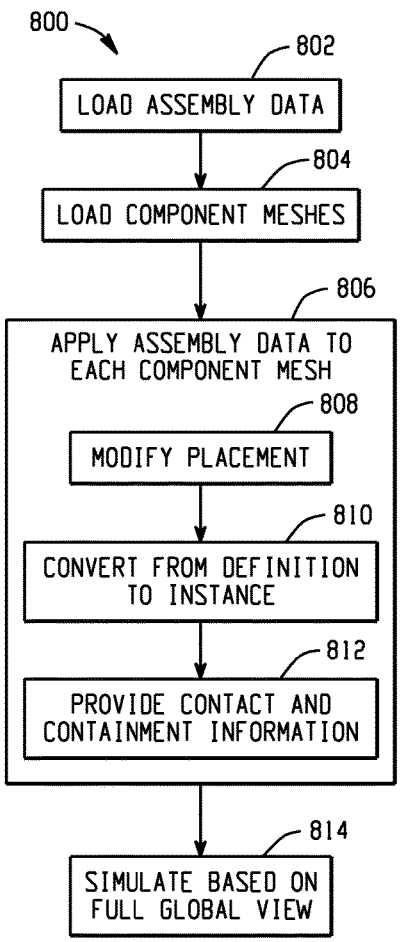
FIG. 8 is a flow diagram depicting example steps for simulating a physical system based on assembly data and component meshes that have been stored in data structures.

FIG. 8 is a flow diagram 800 depicting example steps for simulating a physical system based on assembly data and component meshes that have been stored in data structures. At 802, assembly data is loaded. As described above with reference to FIG. 7A, the assembly data includes, in an example, i) contact maps for facets, edges, etc., and ii) data on containment of components in meshed or unmeshed regions. In other examples, other types of assembly data are loaded at 802. At 804, component meshes are loaded. The component meshes loaded at 804 may be those stored in data structures during the component mesh creation process described above with reference to FIG. 6. At 806, assembly data is applied to each component mesh. The application of the assembly data to each component mesh includes, at 808, modifying a placement of a component mesh within the mesh assembly. The application of the assembly data to each component mesh also includes, at 810, converting a component mesh from definition to instance. Additionally, the application of the assembly data to each component mesh includes, at 812, providing contact and containment information relating to the component mesh. After applying the assembly data to each component mesh, at 814, the mesh assembly is simulated based on the full global view.

Figure 9:
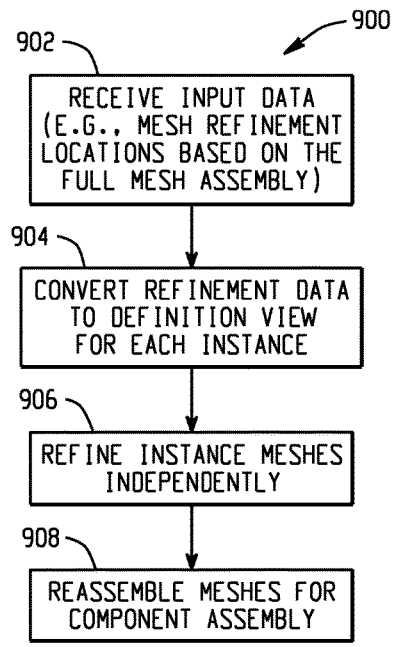
FIG. 9 is a flow diagram depicting example steps for performing mesh refinement.

FIG. 9 is a flow diagram 900 depicting example steps for performing mesh refinement. At 902, input data for the mesh refinement is received. In an example, the input data includes mesh refinement locations that are based on the full mesh assembly. At 904, the input refinement data is converted to definition view for each component instance. At 906, the instance meshes are refined independently. In an example, each instance mesh is refined individually, such that the "divide and conquer" approach described above (i.e., whereby components are meshed individually and then assembled into a larger system) is also used at the mesh refinement stage. At 908, the refined instance meshes are reassembled to form a new mesh assembly. In an example, the assembling of the meshes to form the new mesh assembly is performed in a manner similar to that described above with reference to FIG. 7A.

Figure 10:
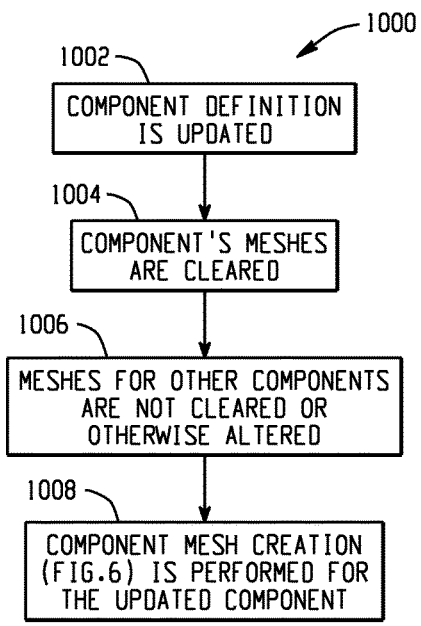
FIG. 10 is a flow diagram depicting example steps for updating a component definition.

FIG. 10 is a flow diagram 1000 depicting example steps for updating a component definition. At 1002, a component definition is updated. At 1004, meshes associated with the updated component definition are cleared. At 1006, meshes not associated with the updated component definition remain and are not cleared. At 1008, component mesh creation steps are performed for the updated component. The component mesh creation steps are similar to those steps described above with reference to FIG. 6. In performing the component mesh creation steps, only the updated component requires a new mesh.

FIG. 11 is a flow diagram 1100 depicting example steps for changing one or more parameters of a component instance. At 1102, a component instance parameter value is changed. At 1104, component mesh creation steps are performed for the component instance with the changed parameter value. The component mesh creation steps are similar to those steps described above with reference to FIG. 6. In performing the component mesh creation steps, at 1106, if the set of parameter values is new, a new mesh is created. In performing the component mesh creation steps, at 1108, if the set of parameter values is not new, an existing mesh is used.

FIG. 12 is a flow diagram 1200 depicting example steps for effecting a component placement change within a system to be simulated. At 1202, a placement of a component is changed. At 1204, mesh assembly data is cleared, but all component meshes remain and are not cleared. In an example, the mesh assembly data includes i) contact maps for facets, edges, etc., and ii) data on containment of components in meshed or unmeshed regions. It is noted that the step 1204 is optional and that it is not necessary to clear all mesh assembly data. Thus, in some embodiments, the step 1204 is performed, and in other embodiments, the step 1204 is not performed. At 1206, steps for component assembly are performed. The component assembly steps are similar to those steps described above with reference to FIG. 7A. The new placement may result in contact and containment changes, and the contact and containment changes may cause stored component meshes to be modified as described above with reference to FIG. 7A (e.g., stored component meshes are modified as needed for simulation, which may include making meshes conformal for contact, creating surrounding meshes for containment, etc.).

FIG. 13 is a flow diagram 1300 depicting an example computer-implemented method of generating a mesh assembly for simulating a physical system. At 1302, a specification of a system having first and second objects is received. The specification includes, for each of the first and second objects, geometric data comprising geometrical attributes of the object and mesh data comprising settings for creating a mesh representation of the object. At 1304, the first object is associated with a first mesh, and at 1306, the second object is associated with a second mesh. The associating includes, for each of the first and second objects, determining if a mesh with geometric data and mesh data corresponding to that of the object has been previously generated. If the mesh has been previously generated, the object is associated with the mesh, and if the mesh has not been previously generated, the object is meshed to generate a new mesh that is associated with the object. At 1308, a mesh assembly including the first and second meshes is generated based on positioning data for the first and second objects included in the specification. At 1310, if the first and second meshes are in contact in the mesh assembly, a mesh of the first mesh and/or the second mesh is modified to cause the meshes to be continuous at an interface between the meshes. Although the contacts between the first and second meshes are described herein as utilizing continuous (i.e., conformal) meshes, in other examples, non-continuous meshes are used at the interfaces between meshes that are in contact.

This written description uses examples to disclose the invention, including the best mode, and also to enable a person skilled in the art to make and use the invention. The patentable scope of the invention may include other examples. Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Further, as used in the description herein and throughout the claims that follow, the meaning of "each" does not require "each and every" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive of" may be used to indicate situations where only the disjunctive meaning may apply.

It is claimed:

1. A computer-implemented method of generating a mesh assembly corresponding to a system, the method comprising:
   receiving a specification of a system having first and second objects, wherein the specification includes for each of the first and second objects:
      attributes of the object including geometric data and mesh data comprising settings for creating a mesh representation of the object;
   associating i) the first object with a first mesh, and ii) the second object with a second mesh, wherein the associating includes, for each of the first and second objects:
      determining whether a mesh corresponding to the geometric data and the mesh data associated with that object has been previously generated, and
      based on a determination that a corresponding mesh has been previously generated, associating the object with the corresponding mesh; or based on a determination that the corresponding mesh has not been previously generated, generating a new mesh based on the geometric data and the mesh data associated with that object;
   generating a mesh assembly including the first mesh and the second mesh based on positioning data attributes of the first object and the second object; and
   based on a determination that the first mesh and the second mesh are in contact in the mesh assembly, modifying the first mesh or the second mesh to cause an interface between the first mesh and the second mesh to be conformal in the mesh assembly by:
      identifying a set of boundary triangles of a cavity of the mesh assembly associated with the first mesh and the second mesh, the boundary triangles forming a set of boundary edges and a set of interior edges;
      identifying a point set comprising points of the boundary triangles;
      testing each point of the point set against each edge of the boundary edge to identify an edge containing point on a first boundary edge;
      deleting the first boundary edge; and
      creating two new boundary edges each sharing the edge containing point an end point of the edge.

2. The computer-implemented method of claim 1, wherein generating the new mesh associated with the first object or the second object is performed independently of generating other meshes associated with other objects included in the system, and wherein generating the new mesh is not based on i) a position of the object within the system, ii) contact between the object and other objects of the system, or iii) containment of the object or another object within the system.

3. The computer-implemented method of claim 2, wherein associating i) the first object with the first mesh, and ii) the second object with the second mesh includes:
   generating the first mesh associated with the first object using a first meshing technique based on the mesh data for the first object; and
   generating the second mesh associated with the second object using a second meshing technique that is different from the first meshing technique, wherein the second meshing technique is based on the mesh data for the second object, and wherein the mesh assembly includes the first and second meshes that are generated based on the first and second meshing techniques, respectively.

4. The computer-implemented method of claim 1 comprising:
   storing the first mesh in a first data structure prior to the modifying of the mesh;
   storing the second mesh in a second data structure prior to the modifying of the mesh, wherein the modifying of the mesh does not alter the meshes stored in the first and second data structures; and
   generating a second mesh assembly, wherein the generating of the second mesh assembly includes retrieving the first mesh stored in the first data structure or retrieving the second mesh stored in the second data structure.

5. The computer-implemented method of claim 1, wherein the specification includes i) assembly-level mesh data comprising settings for generating the mesh assembly, and ii) assembly-level simulation settings for performing simulation of the mesh assembly, the method further comprising:
   storing the first mesh in a first data structure prior to the generating of the mesh assembly;

storing the second mesh in a second data structure prior to the generating of the mesh assembly, wherein the stored first and second meshes are not altered by the generating of the mesh assembly, and wherein the stored first and second meshes are not based on the positioning data, the assembly-level mesh data, and the assembly-level simulation parameters; and generating a second mesh assembly including retrieving the first mesh stored in the first data structure or retrieving the second mesh stored in the second data structure.

6. The computer-implemented method of claim 1, wherein the associating of the first object with the first mesh and the second object with the second mesh comprises:

generating the first mesh associated with the first object using a first meshing scale that is determined based on the mesh data or the geometric data for the first object; and generating the second mesh associated with the second object using a second meshing scale that is determined based on the mesh data or the geometric data for the second object, wherein the second meshing scale differs in size from the first meshing scale by one or more orders of magnitude, and wherein the mesh assembly includes the first and second meshes that are generated based on the first and second meshing scales, respectively.

7. The computer-implemented method of claim 1, wherein the specification of the system includes a third object having geometric data and mesh data equal to that of the first object, and wherein the third object has a placement in the system that differs from that of the first object, the method further comprising:

associating the third object with the first mesh, wherein associating the third object with the first mesh is performed without generating a third mesh associated with the third object, and wherein the mesh assembly includes multiple instances of the first mesh to represent the first object and the third object in the system.

8. The computer-implemented method of claim 1 comprising:

receiving a second specification of a second system, wherein the second specification includes attributes including geometric data and mesh data for a third object;

determining whether the first mesh or the second mesh were generated based on geometric data and mesh data equivalent to that of the third object, and if so, associating the third object with the corresponding first or second mesh without regenerating the first mesh or the second mesh; and generating a second mesh assembly including the third mesh in part according to position data attributes of the third object, wherein the second mesh assembly corresponds to the second system.

9. The computer-implemented method of claim 1 comprising:

editing the positioning data of the specification to alter a position of the first object in the system; and generating a second mesh assembly based on the edited positioning data, wherein the first mesh and the second mesh are not re-meshed prior to the generating of the second mesh assembly.

10. The computer-implemented method of claim 1 comprising:

storing an instance of the first mesh in a first data structure prior to the generating of the mesh assembly, and storing an instance of the second mesh in a second data structure prior to the generating of the mesh assembly, wherein the generating of the mesh assembly includes:

determining whether there is contact between the first and second meshes in the mesh assembly;

determining whether there is containment of the first or second meshes in the mesh assembly; and based on the determination for the contact or based on the determination for the containment, modifying the first mesh or the second mesh included in the mesh assembly, wherein the modifying of the first mesh or the second mesh does not cause an altering of the instance of the first mesh or the instance of the second mesh stored respectively in the first and second data structures.

11. The computer-implemented method of claim 10, wherein when the first mesh is fully contained within the second mesh and when an overlap of the first mesh and the second mesh is in a region of the second mesh corresponding to a uniform body, the method further comprises:

discarding all mesh elements of the second mesh in the overlap region, the second mesh being modified in the discarding; and adjusting the meshes such that the modified second mesh conforms to exterior facets of the first mesh.

12. The computer-implemented method of claim 11, further comprising:

making the first mesh and the modified second mesh conformal.

13. The computer-implemented method of claim 10 comprising:

generating simulation data for the system based on the modified first or second mesh included in the mesh assembly.

14. The computer-implemented method of claim 1 comprising:

storing the geometric data for the first object in a first data structure;

storing the geometric data for the second object in a second data structure;

storing the mesh data for the first object in a third data structure; and storing the mesh data for the second object in a fourth data structure.

15. A non-transitory computer-readable storage medium comprising computer executable instructions which, when executed, cause a processing system to execute the method of claim 1.

16. The computer-implemented method of claim 1, wherein the first mesh is generated according to a first mesh technique and the second mesh is generated according to a second mesh technique, further wherein causing the interface to be continuous includes generating continuous interconnections between the first mesh and the second mesh by modifying a portion of either the first mesh or the second mesh according to a third mesh technique different than the first mesh technique or the second mesh technique.

17. The computer implemented method of claim 1, wherein causing the interface to be continuous includes modifying the first mesh or the second mesh to ensure that there is a one to one relationship between first boundary edges of the first mesh and second boundary edges of the second mesh; or herein causing the interface to be continuous includes modifying the first mesh or the second mesh to ensure that there is a one to one relationship between first boundary endpoints of the first mesh and second boundary endpoints of the second mesh.

18. The computer-implemented method of claim 1, wherein the geometric data includes information describing a shape of the object.

19. A computer-implemented system for generating a mesh assembly corresponding to a system, the computer-implemented system comprising:
one or more data processors;
one or more computer-readable mediums encoded with data, wherein the data includes:
a data structure including a specification of a system having first and second objects, wherein the data structure includes, for each of the first and second objects, attributes of the object including geometric data and mesh data comprising settings for creating a mesh representation of the object;
instructions for commanding the one or more data processors to execute steps comprising:
associating i) the first object with a first mesh, and ii) the second object with a second mesh, wherein the associating includes, for each of the first and second objects:
determining automatically, based on the geometric data and the mesh data whether a mesh corresponding to the geometric data and the mesh data the object has been previously generated, and
based on a determination that a corresponding mesh has been previously generated, automatically associating the object with the corresponding mesh; or based on a determination that the corresponding mesh has not been previously generated, automatically generating a new mesh based on the geometric data and the mesh data associated with the object;
generating a mesh assembly including the first and second meshes based on positioning data attributes of the first and second objects included in the specification; and
based on a determination that the first mesh and the second mesh are in contact in the mesh assembly, modifying the first mesh or the second mesh to cause an interface between the first mesh and the second mesh to be conformal in the mesh assembly by:
identifying a set of boundary triangles of a cavity of the mesh assembly associated with the first mesh and the second mesh, the boundary triangles forming of a set of boundary edges and a set of interior edges;
identifying a point set comprising points of the boundary triangles;
testing each point of the point set against each edge of the boundary edge to identify an edge containing point on a first boundary edge;
deleting the first boundary edge; and
creating two new boundary edges each sharing the edge containing point an end point of the edge.

20. The computer-implemented system of claim 19, wherein generating the new mesh associated with the first object or the second object is performed independently of generating other meshes associated with other objects included in the system, and wherein generating the new mesh is not based on i) a position of the object within the system, ii) contact between the object and other objects of the system, or iii) containment of the object or another object within the system.

21. The computer-implemented system of claim 20, wherein generating the new mesh associated with the first object or the second object includes:
generating the first mesh associated with the first object using a first meshing technique based on the mesh data for the first object; and
generating the second mesh associated with the second object using a second meshing technique that is different from the first meshing technique, wherein the second meshing technique is based on the mesh data for the second object, and wherein the mesh assembly includes the first and second meshes that are generated based on the first and second meshing techniques, respectively.

* * * * *